United States Patent [19]
Beyers et al.

[11] Patent Number: 5,877,621
[45] Date of Patent: Mar. 2, 1999

[54] DIGITAL OSCILLOSCOPE WITH PAN AND ZOOM PRODUCED FROM TIME STAMPED DATA RECORDS INDEXED BY TRIGGER OFFSET

[75] Inventors: Michael L. Beyers, Colorado Spring; Matthew S. Holcomb, Colorado Springs, both of Colo.

[73] Assignee: Hewlett-Packard Company, Palo Alto, Calif.

[21] Appl. No.: 641,244

[22] Filed: Apr. 30, 1996

[51] Int. Cl.[6] .................................................. G01R 13/00
[52] U.S. Cl. .......................................... 324/121 R; 702/66
[58] Field of Search ............................. 324/121 R, 158.1, 324/73.1, 76.11, 76.12; 364/480, 486, 487, 485; 702/66, 67, 68, 70, 71, 76

[56] References Cited

U.S. PATENT DOCUMENTS

| | | | |
|---|---|---|---|
| 4,731,768 | 3/1988 | Easterday | 368/118 |
| 5,072,168 | 12/1991 | Ferguson | 324/121 R |
| 5,446,650 | 8/1995 | Overhage et al. | 364/487 |

*Primary Examiner*—Vinh P. Nguyen

[57] ABSTRACT

Each acquisition record in a random repetitive oscilloscope is time stamped and stored in a location in the acquisition memory indexed by the associated value of trigger offset. Those acquisition records that are older than a selected and variable amount can be discarded instead of being used to contribute data to the waveform record. This has the effect of preventing old data from intruding into a new measurement. When reformulating the waveform record to pan or zoom while using data already acquired, it is possible to ensure that the newest waveform records are included in that reformulation. This has the effect of ensuring that new data is displayed. The time stamp may be a binary count of an elapsed time interval, in units of the sample clock, since some cardinal event, such as the last time ERASE or RESET was pressed. To maximize the random distribution of the trigger offsets represented in the acquisition memory, the rule for deciding which of m-many acquisition records receives this latest data is based on the trigger offset. The first of the acquisition records gets acquisitions whose trigger offsets are at least zero but less than 1/m of a sample period t, the second receives acquisitions whose trigger offsets are at least t/m but less than 2 t/m, and so on.

5 Claims, 1 Drawing Sheet

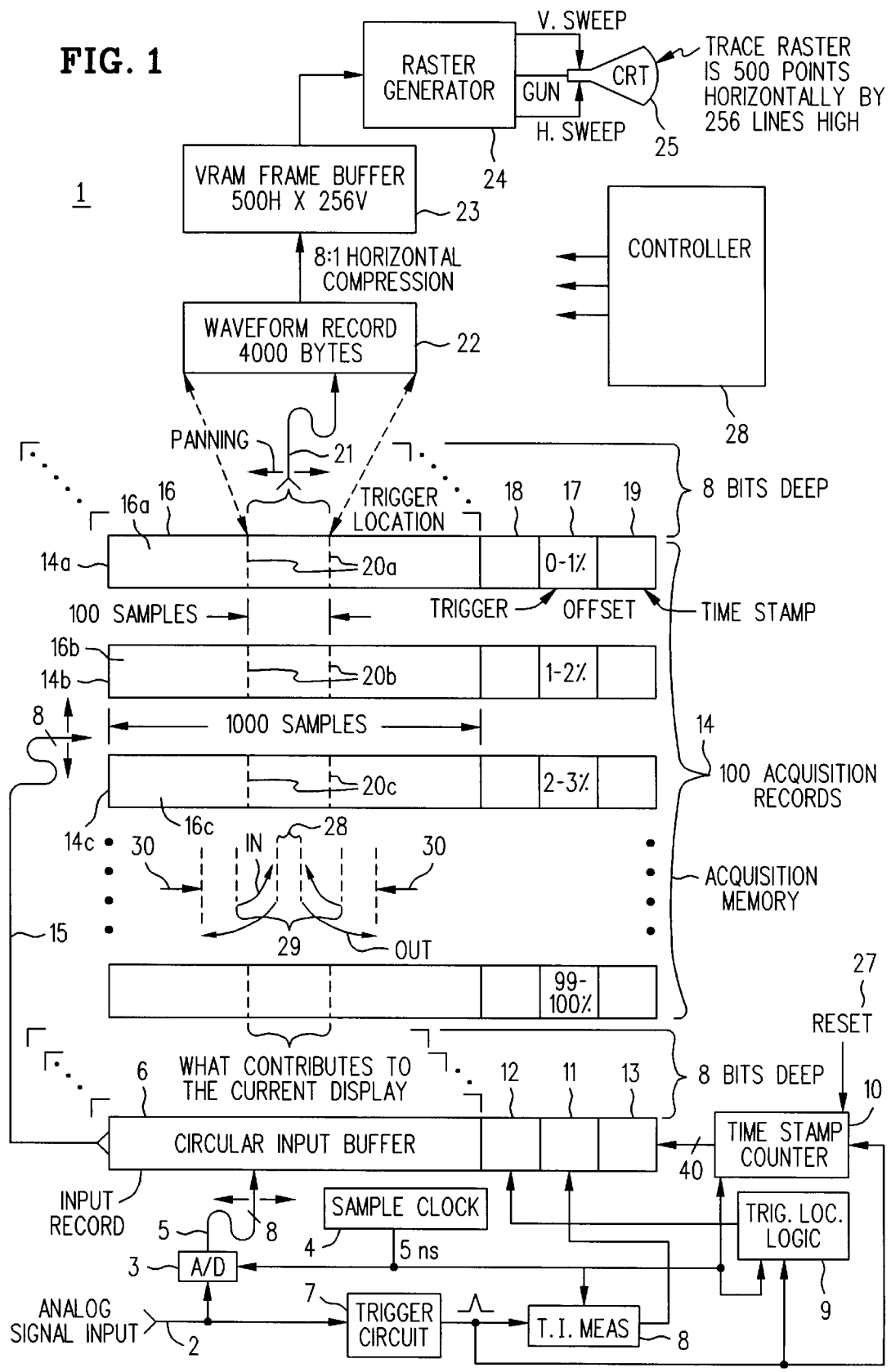

DIGITAL OSCILLOSCOPE WITH PAN AND ZOOM PRODUCED FROM TIME STAMPED DATA RECORDS INDEXED BY TRIGGER OFFSET

BACKGROUND OF THE INVENTION

Among the advantages offered by digital oscilloscopes is the ability to display the same captured data in different ways. The ability to do this arises from there being more captured data than is displayed at any one time on the screen. Depending upon certain constraints connected with sampling rate, memory size and selected sweep speed for the displayed waveform image, one would like to be able to have the oscilloscope reformulate the displayed waveform image to effect zooming in or out (changes in sweep speed) or panning (what segment of the waveform is displayed relative to the trigger). High performance top-of-the-line digital oscilloscopes allow these sorts of operations, but at the price of possessing an expensive architecture. They have very fast sampling rates and relative large sample memories organized as one long time axis. These may be termed "real time" oscilloscopes. Even so equipped, there is often a significant sluggishness in responsiveness to the controls of a real time scope when reformulating the displayed waveform image, owing to the techniques used to interpolate pixels in the frame buffer for x axis locations in the frame buffer not having a corresponding y value in a data record stored in the sample memory.

An architecture that can be used in lower cost digital oscilloscopes of modest performance is one called "random repetitive sampling". The February 1992 issue of the Hewlett-Packard Journal is devoted almost entirely to a description of an early form of this digital oscilloscope architecture (in the form of the then new products HP 54600A and HP 54601A oscilloscopes). In random repetitive sampling the signal to be measured is sampled at a fairly low rate for perhaps a considerable length of time; or a time at least long enough to acquire one sample per pixel position in the x direction (ala real time). This produces a single instance of an acquisition record. This single acquisition record would be suitable for forming a displayed trace if the time span of the displayed trace were to equal the time interval expended to acquire it, and it contained a sufficient number of samples. If that were all there were to random repetitive sampling, then it would be nothing more than very low performance real time sampling. Instead, steps are taken to automatically arrange that the segment of the waveform to appear on the screen is but a fraction of the acquisition record. It will be understood that the points in that fraction are too far apart to produce a satisfactory display. However, owing to the repetitive nature of the waveform, it is possible to acquire many consecutive acquisition records. The performance of the architecture becomes quite acceptable when steps are taken to take notice of the particular offset in the time axis of each acquisition record relative to its associated trigger event, and to ensure relative randomness (as between acquisition records) of the start of the time axis, so as to avoid both redundant samples and holes where there are no acquired data for use in the intended display. With this arrangement the display is formed by investigating the data in not just a particular segment of a single acquisition record, but for an entire collection of such records. If the collection of acquisition records is large enough, there will be almost no holes. It allows pan and zoom by simply selecting the segment of interest in the collection of acquisition records. Panning is accomplished by sliding the segment of interest back and forth along the time axis of the acquisition records, while zooming changes the width of the segment of interest, and relies on there being many acquisition records whose time axes are aligned so as to avoid holes and redundant samples. This scheme does not have the single shot bandwidth that real time does, but is a good compromise for viewing repetitive signals.

Typically, the inspected segments of the acquisition records contribute their data to a waveform record, which when complete, is loaded into a frame buffer composed of video RAMS's. It is the contents of the frame buffer that actually appear on the screen. Now, consider the process of inspecting the acquisition record segments to build the waveform record. There may be, perhaps, one hundred acquisition records, of which only ten percent of each record is the segment presently of interest. Let us say, for the sake of explanation, that each acquisition record holds data for five microseconds worth of time. Each acquisition record is made subsequent to a trigger, and will hold data values for, say, one thousand consecutive samples, say, five nanoseconds apart. The triggering event might not be so agreeable as to occur on exact multiples of the 5 ns sample clock; it can happen whenever it wants to. This gives rise to the trigger offset mentioned above. To characterize the offset it is sufficient to note the time interval between the trigger event and a nearest (either always before or always after) sample clock. The period of the sample clock sets a definite maximum value for the trigger offset. In a conventional digital oscilloscope the newest acquired data is simply stored in the next available acquisition record.

If the signal being measured is ideally repetitive, and never changes, then all the data in the acquisition records is equally valid, and no anomalies will occur in the construction of the waveform record. It can happen, however, that certain acquisition records are "outdated", in the sense that they were made a relatively long time before the latest one. It can be the case that the data in an older acquisition record is, while not wrong, in significant disagreement with newer data, and ought to be suppressed. This happens naturally in a (non-storage tube) analog oscilloscope, owing to the decay of the trace (finite, and short, persistence). It would be desirable if a random repetitive oscilloscope could avoid displaying data older than is appropriate for the measurement being made.

It may also happen with a conventional digital oscilloscope that there is not a random distribution of the trigger offset values represented in the acquisition memory. While this condition cannot entirely be avoided, simple sequential storage of acquisition records in the order that they occur can compound the problem by using up the acquisition memory during an accumulation of too many acquisition records of similarly valued of trigger offset. It would be desirable if a random repetitive digital oscilloscope wold operate in a way that maximized the retention of a collection of acquisition records having a random distribution of trigger offset vales.

SUMMARY OF THE INVENTION

A solution to the problem of displaying inappropriate old data in a random repetitive oscilloscope is to time stamp each of the acquisition records. Then those that are older than a selected and variable amount can be discarded instead of being used to contribute data to the waveform record. This has the effect of preventing old data from intruding into a new measurement. Time stamping also allows an additional advantage. It is that when reformulating the waveform record to pan or zoom while using data already acquired, it is possible to ensure that the newest waveform records are included in that reformulation. This has the effect of ensuring that new data is displayed. The time stamp may be a binary count of an elapsed time interval, in units of the sample clock, since some cardinal event, such as the last time ERASE or RESET was pressed. By allocating a generous number of bits to the count, say forty, one needn't worry that the counter will overflow in less than a reasonable amount of time, measurable in hours.

To maximize the random distribution of the trigger offsets represented in the acquisition memory, the rule for deciding which of the acquisition records (say, there are one hundred of them) receives this latest data is based on the trigger offset. The first of the one hundred acquisition records gets acquisitions whose trigger offsets are at least zero but less than one percent of a sample period, the second of the one hundred acquisition records receives acquisitions whose trigger offsets are at least one percent but less than two percent, and so on. After a suitably long period of time the odds are quite high that all of the acquisition records contain data, so that all ranges in a partition of the period of the sample clock are represented. A useful trace may be displayed, however, even if only some of the acquisition records contain data.

BRIEF DESCRIPTION OF THE DRAWING

FIG. 1 is a simplified block diagram of the data acquisition and display preparation portions of a random repetitive digital oscilloscope constructed in accordance with the principles of the invention.

DESCRIPTION OF A PREFERRED EMBODIMENT

Refer now to FIG. 1, wherein is shown a simplified block diagram 1 of the data acquisition and display preparation portions of a random repetitive digital oscilloscope. The block diagram 1 illustrates the flow of data from an analog signal input 2 to its display upon a CRT 25. The block diagram does not address multiple channel inputs, various rules for allocating memory into different amounts of record length versus number of records (based on control settings, such as sweep speed), nor does it concern itself with the various annotations and measured values that can be written in letters next to the trace. Instead, it addresses an architecture for acquisition memory utilization that allows captured data displayed at a near maximum sweep speed to have its trace reformulated for panning left and right and for zooming in and out, all based on data previously captured and presently in the acquisition memory. It will be perfectly clear to those skilled in the art how to apply these techniques shown here in a simplified single trace environment to the usual more complicated environments having multiple traces with measurement annotations included in the display.

To begin, then, note that an analog signal input 2 is applied to an A/D (Analog to Digital) converter 3 and to a trigger circuit 7. The signal applied to the analog signal input is any time variant voltage to be measured by the oscilloscope, and could be either "analog" or "digital" as far as its function in its native environment is concerned. As far as the oscilloscope is concerned, it is just a (presumably repetitive) time variant voltage whose waveform is to be measured and displayed.

The A/D converter 3 is responsive to a sample clock signal produced by a sample clock circuit 4. We will assume that, for our purposes, the sample clock is fixed at 5 ns per period. Each time a particular edge occurs in the sample clock signal the A/D converter 3 converts the instantaneous value of the applied analog signal input to an 8-bit value (which may be Gray coded or be straight binary). This value is then stored in the next location in a circular input buffer 6 that is large enough to store one thousand eight bit samples. This forms the basis for what will eventually become an input record. The applied analog signal input 2 is also coupled to a trigger circuit 7, whose function it is to "synchronize" the displayed trace with some selected event, such as the input value crossing a threshold in a given manner. The output of the trigger circuit 7 is applied to a time interval measurement circuit 8 and to a trigger location logic circuit 9. The time interval measurement circuit 8 produces what we earlier called the trigger offset, which is some fraction of a sample clock period. That amount of time is stored in a location 11 in the input record (6). The trigger location logic may be thought of as the mechanism that controls the horizontal traverse of the eight bits signal 5 from A/D converter 3 as consecutive samples are stored. A trigger will occur while at some address or location in the circular buffer 6. There is no way to know ahead of time where that will be. It is sufficient to take note of that location when the trigger does occur. It is an identifier of that location (corresponding to the trigger event) that is available from the trigger location logic circuit 9 and is stored in location 12 in the input record. Depending upon where the trigger event is supposed to be relative to the displayed trace, (before, after, or somewhere in the middle) the loading of samples into the circular buffer 6 may be halted immediately, or be allowed to continue for a selected number of samples. This too, is the provence of the trigger location logic circuit 9.

One other thing happens when the trigger occurs. The output of the trigger circuit 7 causes a time stamp counter 10 to store into location 13 of the input record 6 a count of the number of sample clock cycles. This allows a later ordering of the acquisition records 14 (each of which used to be an input record 6 at one time). The count in the time stamp counter is reset to zero when some event corresponding to "let's start over" is executed. An examples of this is pressing an erase key that empties the frame buffer and causes the entire data acquisition process to begin afresh. The time stamp counter itself has a sufficient number of bits that it will not roll over inconveniently in the middle of a measurement (e.g., forty bits at 5 ns per count is about 91 minutes or 1.5 hours between roll overs).

Once the input record is complete it is stored as an acquisition record 14. In our illustrative example of FIG. 1 we assume that there are one hundred acquisition records (14a, 14b, 14c, ...), each large enough to store one thousand eight bit samples (16 in 14a) plus their associated trigger location, trigger offset and time stamp (e.g., respectively 18, 17 and 19 in 14a). Line 15 represents an eight bit data path from the circular buffer 6 to the appropriate acquisition record. Sample portion 16 may be thought of as being eight bits deep, as is the corresponding portion of the circular input buffer 6. The portions 11, 12 and 13, as well as 17, 18 and 19, are of course, as big or small as required for the range of values over which their respective contents may range. Which of the various acquisition records 14 is the actual destination of the input record in circular buffer 6 is determined by the trigger offset value associated with the input record. We refer to this feature as "indexing". Each of the acquisition records 14 is assigned the task of representing a certain range of possible values of the trigger offset. In our example there are one hundred acquisition records, so each corresponds to a different one percent range of the possible value, which it will be recalled, is the period of the sample clock (5 ns). While the oscilloscope is operating in a mode where the trace is automatically changed as new data is sampled, the process described above is in effect continuously. Eventually each acquisition record will contain useful data.

The trace on the CRT 25 is created by a raster scan sweep mechanism 24 that accepts data from a bit-mapped frame buffer 23. As far as the waveform trace is concerned, the content of the bit-mapped frame buffer 23 corresponds exactly to the image to be displayed on the CRT 25. The frame buffer may contain other image information, such as soft keys, labels, operator determined control settings, cursors and measurement values. The trace data of the frame buffer 23 is taken from another buffer mechanism called a waveform record 22.

Waveform record 22 represents a trace that is, say, eight times denser than what can be seen on the screen of the CRT 25. That is, waveform record 22 has four thousand bytes to correspond to five hundred pixel columns across the waveform trace. Let these columns be named 000–499 and let the byte locations be named 0000–3999. Then the first eight bytes 0000–0007 all correspond to column 000, then next eight byte locations 0008–0013 all correspond to column 001, and so on. Each of the four thousand bytes is an eight bit byte, and so holds a vertical (y direction) value for the pixel column (x value) it is associated with. This means that a given pixel column in the waveform trace can have as many as eight different pixels illuminated, if each of the eight is at a different y value. This mechanism of multiple y's for each x assists in accurately representing noisy signals, as well as producing a more satisfactory display of vertical edges, as are found on clock signals with short rise times. Thus, the data moving from the waveform record 22 to the frame buffer 23 may be thought of as undergoing an eight to one horizontal compression that is produced by a reduction to one eighth horizontal resolution. It may also be thought of as a rounding operation in the x direction while retaining the available resolution in y.

Now notice the region 20a in acquisition record 14a. This is the portion of that acquisition record that corresponds to the end point bytes 0000 and 3999 in waveform record 22. It might be, say, one hundred samples. Each of the other acquisition records has its own such region: 20b in 14b; 20c in 14c; and so on. We show 20a, 20b and 20c in vertical alignment merely as a convenience. Since they began life in the circular buffer 6, they could really be anywhere within the sample portion 16. Their actual individual locations are found relative to their particular trigger locations (18). Anyway, the point to notice is that it is these regions 20a, 20b, 20c, . . . that are inspected to produce the content of the waveform record 22.

At this point it will be appreciated that, even if the A/D sampling of the analog input signal is stopped, the displayed trace can (within limits imposed by the amount of memory and the sampling rate, naturally) be reformulated with either a zooming operation or a panning operation, or both. The data is all there in the acquisition records 14; what is needed is to differently identify the regions 20 and then re-load the waveform record 22 and frame buffer 23. To pan, for example, the width of regions 20 would be left as it is, but their location in the acquisition records would traverse earlier ("left") or later ("right") with respect to the trigger location. This is the meaning of the legend PANNING and the horizontal arrows next to the squiggly line 21 that represents the data path from the acquisition records to the frame buffer. Zooming, on the other hand, involves changing the width of the regions 20. To zoom in we narrow a wide region 29 to region 28; this can be done until there are too few samples to work with. To zoom out we expand a narrow region 28 to be a wider one 29. This works until there are no samples corresponding to the period of time being contemplated.

Now consider the time stamp mechanism. It includes a time stamp counter 10, which may be a 40-bit binary counter counting cycles of the sample clock circuit 4. Other counting schemes besides binary may be used, including Gray coding, and other counting formats besides integer counts may be used, including actual representations of the date and/or time. The time stamp counter 10 is reset by a RESET signal 27 that may be derived (not shown) from any convenient event that corresponds to discarding altogether a previous measurement, and starting over with a new one. This might be, for example, the pressing by the operator of an ERASE key. When the trigger circuit 7 produces a trigger signal the time stamp counter outputs its value into location 13 of the circular input buffer 6. From there it eventually ends up in one of the locations 19 in the acquisition memory 14.

Time stamping assists in the reformulation of the waveform record 22 when panning and zooming on data already acquired. First, it is now possible to ensure that the most recent acquisition records are included in the new version of the waveform record 22. This avoids data "going away". Next, it is also possible to limit how old an acquisition record can be an still be included. This avoids old data "coming back". "Old" is relative, and can be either set by the designer of the oscilloscope system as a function of control settings by the operator, or it can be a limit directly selectable by the operator. In any event, it is probably, but not necessarily, a value in the range of twenty to five hundred milliseconds.

It will be understood that the features of (1) time stamping and (2) indexing the storing of the input record 6 into the acquisition records of the acquisition memory 14 according to a mapping from the trigger offset value 11 into a partition on the period of the sample clock 14, are independent. That is, an digital oscilloscope might employ time stamping of input records and not index them, and might index them but not use time stamping.

Finally, the above described internal operation of the oscilloscope of the block diagram 1 is controlled by a controller 26 in accordance with pre-programmed rules implemented by high-speed processors and state machines, in response to the front panel control settings set either by the operator or by a remote device (e.g., a computer) via a data communications or a network interface.

We claim:

1. A method of oscillographic representation of a time variant waveform comprising the steps of:
   (a) sampling the amplitude of the time variant waveform at time determined by a sample clock to produce a sequence of digital amplitude values;
   (b) storing the sequence of digital amplitude values in a circularly addressed input memory of k-many addressable locations, the earliest stored digital amplitude value being overwritten by the newest digital amplitude value being stored;
   (c) generating a trigger signal from the time variant waveform upon the occurrence therein of a selected waveform feature;
   (d) subsequent to step (c), storing the next n-many digital amplitude values in the input memory, n being selectable to be $0 \leq n \leq n_{max}$;
   (e) subsequent to step (c), measuring as a trigger offset value the time interval between the onset of the trigger signal and an adjacent in time instance of the sample clock;

(f) subsequent to step (c), generating a time stamp value indicative of when along a time axis step (c) occurred, the time axis having an origin located prior to the start of the oscillographic representation of the time variant waveform and extending beyond the longest length of time that any instance of oscillographic representation might be expected to require;

(g) subsequent to steps (d), (e) and (f), storing the contents of the circularly addressed input memory, its associated trigger offset value and its associated time stamp value as an acquisition record in an acquisition memory containing a plurality of such acquisition records;

(h) creating a waveform record from an inspection of the stored digital amplitude values in the acquisition memory; and (i) generating a visual image of the waveform record.

2. A method as in claim 1 wherein step (h) includes the step of excluding acquisition records whose time stamp value is less than a selected value.

3. A method as in claim 1 wherein step (h) includes the step of ensuring that acquisition records whose time stamp value is at least a selected value are included in the waveform record.

4. A method of oscillographic representation of a time variant waveform comprising the steps of:

(a) sampling the amplitude of the time variant waveform at time determined by a sample clock to produce a sequence of digital amplitude values;

(b) storing the sequence of digital amplitude values in a circularly addressed input memory of k-many addressable locations, the earliest stored digital amplitude value being overwritten by the newest digital amplitude value being stored;

(c) generating a trigger signal from the time variant waveform upon the occurrence therein of a selected waveform feature;

(d) subsequent to step (c), storing the next n-many digital amplitude values in the input memory, n being selectable to be $0 \leq n \leq n_{max}$;

(e) subsequent to step (c), measuring as a trigger offset value the time interval between the onset of the trigger signal and an adjacent in time instance of the sample clock;

(f) subsequent to steps (d) and (e), storing the contents of the circularly addressed input memory and its associated trigger offset value as an acquisition record in an acquisition memory containing a plurality m of such acquisition records, each record corresponding to a different portion of a partition of the period of the sample clock into m-many equal and adjacent time value ranges;

(g) creating a waveform record from an inspection of the stored digital amplitude values in the acquisition memory; and (h) generating a visual image of the waveform record.

5. A method of oscillographic representation of a time variant waveform comprising the steps of:

(a) sampling the amplitude of the time variant waveform at time determined by a sample clock to produce a sequence of digital amplitude values;

(b) storing the sequence of digital amplitude values in a circularly addressed input memory of k-many addressable locations, the earliest stored digital amplitude value being overwritten by the newest digital amplitude value being stored;

(c) generating a trigger signal from the time variant waveform upon the occurrence therein of a selected waveform feature;

(d) subsequent to step (c), storing the next n-many digital amplitude values in the input memory, n being selectable to be $0 \leq n \leq n_{max}$;

(e) subsequent to step (c), measuring as a trigger offset value the time interval between the onset of the trigger signal and an adjacent in time instance of the sample clock;

(f) subsequent to steps (d) and (e), storing the contents of the circularly addressed input memory and its associated trigger offset value as an acquisition record in an acquisition memory containing a plurality m of such acquisition records, each record corresponding to a different portion of a partition of the period of the sample clock into m-many equal and adjacent time value ranges;

(g) subsequent to step (c), generating a time stamp value indicative of when along a time axis step (c) occurred, the time axis having an origin located prior to the start of the oscillographic representation of the time variant waveform and extending beyond the longest length of time that any instance of oscillographic representation might be expected to require;

(h) subsequent to steps (d), (e) and (g), storing the contents of the circularly addressed input memory, its associated trigger offset value and its associated time stamp value as an acquisition record in an acquisition memory containing a plurality of such acquisition records;

(i) creating a waveform record from an inspection of the stored digital amplitude values in the acquisition memory; and (j) generating a visual image of the waveform record.

* * * * *